United States Patent
Bartling et al.

(10) Patent No.: US 6,944,739 B2
(45) Date of Patent: Sep. 13, 2005

(54) REGISTER BANK

(75) Inventors: James R. Bartling, Chandler, AZ (US);
Joseph A. Thomsen, Gilbert, AZ (US);
Randy Yach, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 727 days.

(21) Appl. No.: 09/957,283

(22) Filed: Sep. 20, 2001

(65) Prior Publication Data

US 2004/0151047 A1 Aug. 5, 2004

(51) Int. Cl.$^7$ ................................................. G06F 12/00
(52) U.S. Cl. ........................... 711/168; 711/154; 711/5; 710/29; 710/49
(58) Field of Search ................................. 711/1, 5, 154, 711/168; 710/29, 49

(56) References Cited

U.S. PATENT DOCUMENTS 6,104,728 A * 8/2000 Heinrich ..................... 370/475
6,647,440 B1 * 11/2003 Birns et al. .................. 710/29

* cited by examiner

Primary Examiner—T Nguyen
(74) Attorney, Agent, or Firm—Baker Botts L.L.P.

(57) ABSTRACT

A filter register bank, for example, for a CAN module provides parallel and serial access. The filter bank comprises a plurality of memory cells arranged in a matrix of columns and rows, wherein for parallel access all memory cells within a row are selectable and coupled with a first plurality of bus lines and for serial access all memory cells within a column are selectable and coupled with a second plurality of bus lines.

26 Claims, 7 Drawing Sheets

REGISTER BANK

FIELD OF THE INVENTION

The present invention relates generally to a register bank, for example, for a serial communication device, in particular a Controller Area Network (CAN) device. Furthermore, the present invention relates to a microcontroller with a serial communication device and a method of operating a serial communication device.

BACKGROUND OF THE RELATED TECHNOLOGY

Controller Area Network (CAN) is a serial communications protocol which efficiently supports distributed real-time control with a high level of security. Applications of CAN range from high speed digital communications networks to low cost multiplex wiring. CAN is a high-integrity serial data communications bus for real-time applications. CAN operates at data rates of up to 1 Megabits per second, has excellent error detection and confinement capabilities, and was originally developed for use in automobiles. The interface between the CAN bus and the CPU is usually called the CAN controller. The motivation behind CAN was to make automobiles more reliable, safe and fuel-efficient by improving the interoperability of automotive electronics, engine control units, sensors, anti-skid brake systems, etc., while decreasing wiring harness weight and complexity. Since CAN's inception, the CAN protocol has gained widespread popularity in industrial automation and automotive/truck applications. The robustness of the CAN bus in noisy environments and the ability to detect and recover from fault conditions makes CAN suitable for use with, industrial control equipment, medical equipment, test equipment, mobile and portable machines, appliances, etc.

CAN is an asynchronous serial bus system with one logical bus line. It has an open, linear bus structure with equal bus nodes. A CAN bus consists of two or more nodes. The number of nodes on the bus may be changed dynamically without disturbing the communication of the other nodes.

The CAN logic bus corresponds to a "wired-AND" mechanism, "recessive" bits (mostly, but not necessarily equivalent to the logic level "1") are overwritten by "dominant" bits (mostly logic level "0"). As long as no bus node is sending a dominant bit, the bus line is in the recessive state, but a dominant bit from any bus node generates the dominant bus state. Therefore, for the CAN bus line, a medium is chosen that is able to transmit the two possible bit states (dominant and recessive). A common physical medium used is a twisted wire pair. The bus lines are then called "CANH" and "CANL," and may be connected directly to the CAN controller nodes or via a connector thereto.

In the CAN bus protocol it is not bus nodes that are addressed, but rather the address information is contained in the messages that are transmitted. This is done via an identifier (part of each message) which identifies the message content, e.g., engine speed, oil temperature, etc. The identifier additionally indicates the priority of the message. The lower the binary value of the identifier, the higher the priority of the message (more dominant bits).

The original CAN specifications (Versions 1.0, 1.2 and 2.0A) defined the message identifier as having a length of 11 bits, giving a possible 2048 message identifiers. An "extended CAN" specification Version 2.0B allows message identifier lengths of 11 and/or 29 bits to be used (an identifier length of 29 bits allows over 536 Million message identifiers). The CAN specifications (all versions) are incorporated by reference herein for all purposes.

Generally, two approaches may be used for CAN since an architecture for the CAN controller is not covered by the CAN standard, these two approaches are: "BasicCAN" and "FullCAN" (not to be confused with CAN 1 and CAN 2, or standard identifiers and extended identifiers); they differ in the buffering of messages.

The BasicCAN controller architecture is similar to simple UART, except that complete frames are sent instead of characters. Typically, there is a single transmit buffer and a double-buffered receive buffer. For example, a microcontroller puts a frame in the transmit buffer, and receives an interrupt when the frame is sent. When a frame is received in the receive buffer, the microcontroller receives an interrupt to empty the receive buffer and empties the frame from the receive buffer before a subsequent frame is received. In the BasicCAN controller architecture the microcontroller must manage the transmission and reception, and handle the storage of the frames.

The FullCAN controller architecture stores frames in the controller itself. A limited number of frames may be dealt with. Each frame buffer is tagged with the identifier of the frame mapped to the buffer. The microcontroller can update a frame in the buffer and mark it for transmission. Receive buffers can be examined to see if a frame with a matching identifier has been received. In addition, filters may be used to pre-screen a received frame so that only those frames intended for use by the particular CAN controller is stored in a receive buffer.

Standard CAN vs. Extended CAN

The CAN protocol usually comes in two versions: CAN 1.0 and CAN 2.0. CAN 2.0 is backwardly compatible with CAN 1.0, and most new controllers are built according to CAN 2.0. There are two parts to the CAN 2.0 standard: part A and part B. With CAN 1.0 and CAN 2.0A, identifiers must be 11-bits long. With CAN 2.0B identifiers can be 11-bits (a "standard" identifier) or 29-bits (an "extended" identifier). To comply with CAN 2.0 a controller must be either 2.0 part B passive, or 2.0 part B active. If it is passive, then it must ignore extended frames (CAN 1.0 controllers will generate error frames when they see frames with 29-bit identifiers). If it is active then it must allow extended frames to be received and transmitted. There are some compatibility rules for sending and receiving the two types of frames:

CAN 2.0B active controllers will send and accept both standard and extended frames.

CAN 2.0B passive controllers will send and receive standard frames, and will discard extended frames without error.

CAN 1.0 controllers will generate errors when they see extended frames.

So a network where there is a single CAN 1.0 controller on the network cannot live with extended frames on the network; all the controllers must send using standard frames.

Controller Architectures

The architecture of controllers isn't covered by the CAN standard, so there is a variation in how they are used. There are, though, two general approaches: BasicCAN and FullCAN (not to be confused with CAN 1.0 and 2.0, or standard identifiers and extended identifiers); they differ in the buffering of messages.

In a BasicCAN controller the architecture is similar to a simple UART, except that complete frames are sent instead of characters: there is (typically) a single transmit buffer, and a double-buffered receive buffer. The CPU puts a frame in the transmit buffer, and takes an interrupt when the frame is sent; the CPU receives a frame in the receive buffer, takes an interrupt and empties the buffer (before a subsequent frame is received). The CPU must manage the transmission and reception, and handle the storage of the frames.

In a FullCAN controller the frames are stored in the controller. A limited number of frames can be dealt with (typically 16); because there can be many more frames on the network, each buffer is tagged with the identifier of the frame mapped to the buffer. The CPU can update a frame in the buffer and mark it for transmission; buffers can be examined to see if a frame with a matching identifier has been received.

The intention with the FullCAN design is to provide a set of "shared variables" in the network; the CPU periodically updates the variables (i.e., the contents of frames in the buffer); the CPU also can examine the variables. In practice, things are not so simple (of course) because of concurrency difficulties: while reading a set of bytes from a frame, the controller could overwrite the data with the contents of a new frame, and in many controllers this is signaled only by a status flag.

In "Basic CAN" implementations, there is generally one double buffered receive channel with one or more associated message acceptance filters. Having but one double buffered message channel means that the processor must be capable of handling the previous message within this time. In "Full CAN" implementations, there are generally up to 15 message buffers or channels, each with one associated message acceptance filter. Having a large number of receive-buffers can be helpful in dealing with bursts of message traffic if the processor is very slow, however, if the total message traffic is such that it overwhelms the processor capability, no amount of buffering can prevent the eventual loss of a message. If a processor's CPU is very slow, to receive many different addressed messages requires separate receive buffers and acceptance filters. With a faster processor, it is possible to use a more limited number of receive buffers with flexibility in the programming of the acceptance filters. In short, the processor must have the bandwidth to service the total traffic on the bus. A plurality of buffers is usually implemented as a compromise. However, each receive buffer has associated a plurality of mask registers and filter registers as well as associated comparators. This requires a large amount of silicon real estate.

There is, therefore, a need in the art for a CAN implementation that does not require a large amount of silicon area.

SUMMARY OF THE INVENTION

The invention overcomes the above-identified problems as well as other shortcomings and deficiencies of existing technologies by a filter register bank for a CAN module providing parallel and serial access. The filter bank comprises a plurality of memory cells arranged in a matrix of columns and rows, wherein for parallel access all memory cells within a row are selectable and coupled with a first plurality of bus lines and for serial access all memory cells within a column are selectable and coupled with a second plurality of bus lines.

Another exemplary embodiment is a CAN module receiving a serial bit stream comprising a filter register comprising a plurality of memory cells arranged in a matrix of columns and rows, wherein for parallel access all memory cells within a row are selectable and coupled with a first plurality of bus lines and for serial access all memory cells within a column are selectable and coupled with a second plurality of bus lines. A column select unit for selecting a column of the filter register bank in accordance with the serial bit stream and a plurality of comparators coupled with the single bit column and with the serial bit stream for generating a plurality of comparison signals are provided. Furthermore, a plurality of registers receiving the plurality of comparison signals for accumulating a plurality of comparison results for each comparison and for generating a plurality of acceptance signals is provided.

A further enhancement can comprise a mask register with a bit select input and a single bit output and a plurality of mask units receiving the mask single bit output and the respective comparison result and generating a plurality of result signals being fed to the plurality of registers. In addition, at least two mask registers with a bit select input and a single bit output and a plurality of multiplexers for selecting one of the mask register single bit outputs can be provided.

A method of operating a CAN module comprises the steps of:

writing a filter value in parallel into a filter bank;
receiving a data stream including an identifier and data;
comparing said identifier with a plurality of filter values on a bit by bit base;
generating an acceptance signal for each comparison if said identifier comparison is positive.

The method can further comprise the step of masking the comparison result on a bit by bit base and the step of selecting a mask value from a plurality of mask values. The filter values can provide additional data information for selecting the mask value. The mask values can be selected from a plurality of mask registers and/or filter registers. One mask value can provide a non-masking function.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
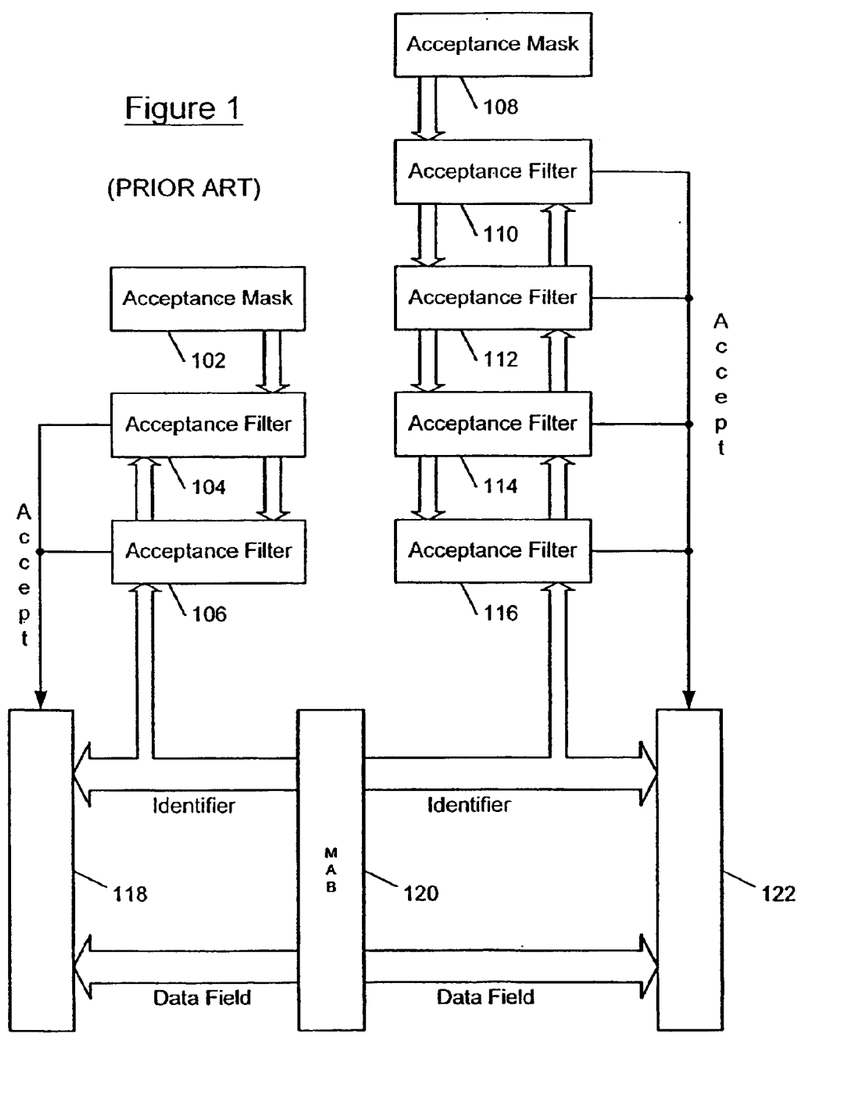
FIG. 1 is a schematic diagram of the receive buffers and their associated filters according to the prior art.

Referring to FIG. 1, receive buffers 118, 120, and 122 and associated mask 102, 108 and filter registers 104, 106, 110, 112, 114, 116 according to the prior art are illustrated. Buffer 120, designated as a message assembly buffer (MAB), functions only to monitor the CAN logic bus (not shown) for incoming messages. The MAB 120 holds a de-stuffed bit stream from the bus line. The bit stream consists of a message, i.e., a data frame, remote frame, or other frame, comprising an identifier and data field (not shown). The MAB 120 allows receive buffers 118 and 122 parallel access to the message. MAB 120 also allows acceptance filters 106 and 116 access to the identifier portion of the message. Parallel transfer of the bit stream message to receive buffers 118 or 122 is not allowed until acceptance masks 102 and 108 and acceptance filters 104, 106, 110, 112, 114, and 116 apply an acceptance match test to the message.

Programmable acceptance filter masks 102 and 108, respectively, are used to select which bits of the unstuffed bit-stream message should be compared with the contents of acceptance filters 104 and 106, and 110, 112, 114, and 116.

The acceptance match test proceeds as follows: Filters 104, 106, 110, 112, 114, and 116 receive the identifier field of the message and compare that field to filter values. If there is a match between the identifier field and a filter value, then the message is loaded into the matching filter's corresponding receive buffer 118 or 122. Filters 104 and 106 are connected to buffer 118, filters 110, 112, 114, and 116 to buffer 122.

There is an implied priority to the receive buffers. Buffer 118 is the higher priority buffer and has message acceptance filters 104 and 106 associated with it. Buffer 122 is the lower priority buffer and has acceptance filters 110, 112, 114, and 116 associated with it. That fewer filters are associated with buffer 118 than with buffer 122 means that buffer 118 is more restrictive than buffer 122. The more restrictive buffer 118 has, by implication, the higher criticality associated with it.

On the occasion when two "high-priority" messages are received by MAB 120 in quick succession, receive buffer 118, designated as the first high-priority buffer, will receive the first high-priority message. Upon receipt of the second high-priority message, MAB 120 finds that buffer 118 is currently occupied by a high-priority message. MAB 120 then directs buffer 122, designated as the second high-priority buffer, to receive the second high-priority message. Buffers 118 and 122 are ranked, respectively, as the first high-priority buffer and the second high-priority buffer in this scenario.

The central processing unit (CPU) (not shown) may operate on one of the receive buffers 118 and 122, while the other is available for reception or holding a previously received message.

The protocol in the case of the arrival of two high-priority messages is effected by the BUKT bit in the control registers (not shown) of receive buffers 118 and 122. Table I depicts and explains the control register of receive buffer 118, wherein R/W means Readable/Writable bit, and wherein R means Read-only bit.

TABLE I

| bit7 | bit6 | bit5 | bit4 | bit3 | bit2 | bit1 | bit0 |
|------|------|------|------|------|------|------|------|
| R/W | R/W | R/W | R/W | R/W | R/W | R | R/W | bit7: Message Ready Status
   1=Receive Buffer contains a valid received message
   0=Receive Buffer open to receive new message
   Bit is only set by CAN module, bit is only cleared by CPU.

bit6-5: Receive Buffer Operating Mode
   11=receive all messages including those with errors
   10=receive only valid messages with extended identifiers
   01=receive only valid messages with standard identifiers
   00=receive all valid messages bit4: Message Reception Interrupt Enable
   1=Interrupt Enabled
   0=Interrupt Disabled bit3: Received Remote Transfer Request
   1=Remote Transfer Request Received
   0=No Remote Transfer Request Received bit2: (BUKT) Enable Overflow to Receive Buffer 122
   1=Receive Buffer 118 Overflow Will Write to Buffer 122
   0=No Overflow to Buffer 122 Allowed bit1: Read Only Copy of bit2 (BUKT)

bit0: Indicates which acceptance filter enabled the message reception
   1=acceptance filter associated with Buffer 122
   0=acceptance filter associated with Buffer 118
   If set to "1," the BUKT bit implements the priority-based protocol of the present invention.

Table II depicts and explains the control register of receive buffer 122.

TABLE II

| bit7 | bit6 | bit5 | bit4 | bit3 | bit2 | bit1 | bit0 |
|------|------|------|------|------|------|------|------|
| R/W | R/W | R/W | R/W | R/W | R/W | R/W | R/W | bit7: Message Ready Status
   1=Receive Buffer contains a valid received message
   0=Receive Buffer open to receive new message
   Bit is only set by CAN module, bit is only cleared by CPU.

bit6-5: Receive Buffer Operating Mode [these bits are optional]
   11=receive all messages including those with errors
   10=receive only valid messages with extended identifiers
   01=receive only valid messages with standard identifiers
   00=receive all valid messages bit4: Message Reception Interrupt Enable
   1=Interrupt Enabled
   0=Interrupt Disabled bit3: Received Remote Transfer Request
   1=Remote Transfer Request Received
   0=No Remote Transfer Request Received bit2-0: Indicates which acceptance filter enabled the message reception
   101=acceptance filter 116
   100=acceptance filter 114
   011=acceptance filter 112
   010=acceptance filter 110
   001=acceptance filter 106 [only if BUKT bit set to "1" in control register for buffer 118]
   000=acceptance filter 104 [only if BUKT bit set to "1" in control register for buffer 118]

Figure 2:
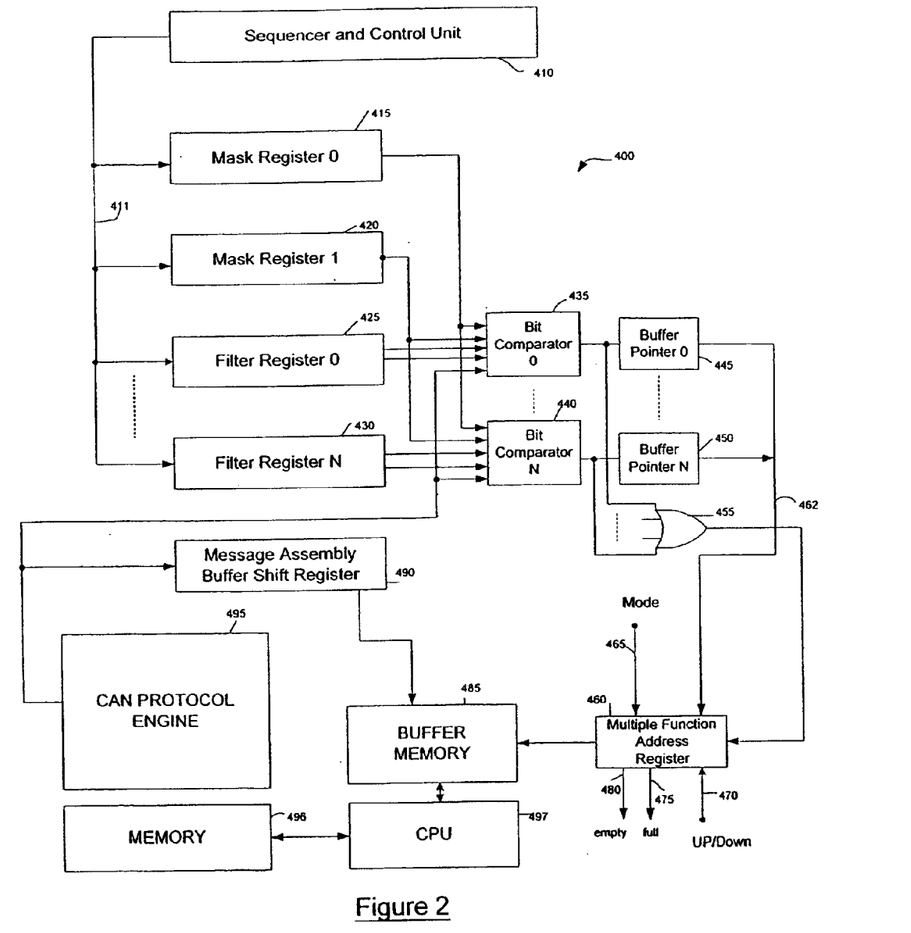
FIG. 2 is a schematic diagram of the receive buffers and their associated filters and comparators according to a first exemplary embodiment of the present invention.

FIG. 2 shows an exemplary embodiment of the present invention with a serial comparison according to the present invention. A first and second mask register 415 and 420 are bit-wise addressable and comprise a single output bit. Furthermore, a plurality of filter registers 0 . . . N (only two are shown) are designated by numerals 425 and 430. The filter registers 425, 430 also comprise a single output bit and are bit-wise addressable. In addition, mask registers 415 and 420 as well as all filter registers 425, 430 are read and write-able in a parallel mode by a central processing unit 497 (connection not shown in FIG. 2). A sequencer and control unit 410 operates as a bit select unit and generates address signals which are fed to mask register 415 and 420 and all filter registers 425, 430. Each filter register 425, 430 comprises an associated bit comparator unit 435, 440. The bit output signal of mask register 415 and 420 are fed to first and second inputs of bit comparator units 435, 440. Furthermore, each bit output of the filter registers 425, 430 is fed to a third input of their associated bit comparator unit 435, 440. A bit stream signal from a CAN bus is provided by a CAN protocol engine 495 and fed to a fourth input of each bit comparator unit 435, 440. Filter registers 425, 430 can be provided with additional storage bits which are coupled with a fifth input of each associated bit comparator unit. The output of each bit comparator unit 435, 440 carries the acceptance signal and is coupled with a control input of an associated buffer pointer 445, 450. An OR gate 455 is provided having as many inputs as the number of filter registers. Each input receives an acceptance signal from a respective bit comparator unit 435, 440. The outputs of each buffer pointer 445 and 450 are coupled with a buffer pointer bus 462 which is connected to an address input of a multiple function address register 460. The output of OR gate 455 is coupled with a control input of multiple function register 460. Multiple function register 460 further comprises a mode control input 465, a first status output 475 indicating whether a buffer memory 485 is full, a second status output 480 indicating whether a buffer memory 485 is empty, and an up/down control input for a counter function of the multiple function address register 460. An address output 464 of multiple function address register 460 is coupled with the address input of buffer memory 485. Buffer memory 485 is preferably a dual port memory whose first port is coupled with a message assembly buffer shift register 490 receiving the serial data stream from the CAN protocol engine 495. The second port of buffer memory 485 is coupled with central processing unit 497 which is furthermore coupled with a memory 496 for storing program and data information.

Even though not crucial to the present invention, this embodiment provides two options to write data from a serial data stream into the buffer memory 485. Both options can be implemented as a stand alone embodiment or combined as shown in FIG. 2 with the features of the present invention. The comparison of filter values stored in filter registers 425, 430 and transmitted identifiers is done in a bit-wise fashion rather than in parallel. Thus, parallel comparators, which need a relatively big amount of silicon real estate, are avoided. A serial data stream provided by CAN protocol engine 495 comprises an identifier which is fed directly to all bit comparator units 435, 440. Sequencer and control unit 410 address the mask registers 415, 420 and all filter registers 425, 430 to output a corresponding bit to the bit comparator units 435, 440. The bit comparator units 435, 440 compare all filter register bits with the respective identifier bit within a frame. The result is further processed by comparing it to the respective mask register bit. To this end, the additional storage bits of each filter register 425, 430 can indicate which mask register should be used for this comparison. This function will be explained in more detail below. The final comparison result will be accumulated for all bits of each identifier within a frame. If a single comparison fails, the acceptance signal will not be generated. If every bit comparison is positive, the acceptance signal will be fed to the respective buffer pointer 445, 450 and to a respective input of OR gate 455.

A central processing unit can control the multiple function address register 460 in the following manner. Two modes can be selected through mode signal 465. In the first mode, the buffer pointer 445, 450 work in the same way as described above in conjunction with FIG. 2. Multiple function address register 460 latches an address which has been put on address bus 462 and addresses buffer memory 485 stores data in parallel that has been assembled by message assembly buffer shift register 490.

A second mode can be selected by means of control signal 465. In this mode, the buffer pointers 445, 450 are not needed and therefore, their output signals will be neglected. When this mode is activated, the actual address register within multiple function address register is, for example, set to "Fh" and the status signal 480 will signal an empty buffer. Every time a bit comparator unit 435, 440 generates an acceptance signal this triggers an increment function of the multiple function address register 460 and its content will therefore be incremented by 1. Thus, the first data assembled by message assembly buffer shift register 490 will be stored at memory location 0. This function provides a so called FIFO functionality of the CAN module in which no buffer is associated with any bit comparator. The buffer memory 485 will be sequentially written until the address reaches "Fh" again which indicates that the buffer is full unless the CPU has read previous entries. A full buffer memory 485 will be indicated by control signal 475. In an additional mode, control signal 470 can select between an incrementing and decrementing function of the address register. Additional signals can be provided by the CPU to indicate whether a buffer value has been read for generating the proper status signals 475, and 480 and to ensure that no value will be overwritten before it has been fetched by the CPU.

Figure 3:
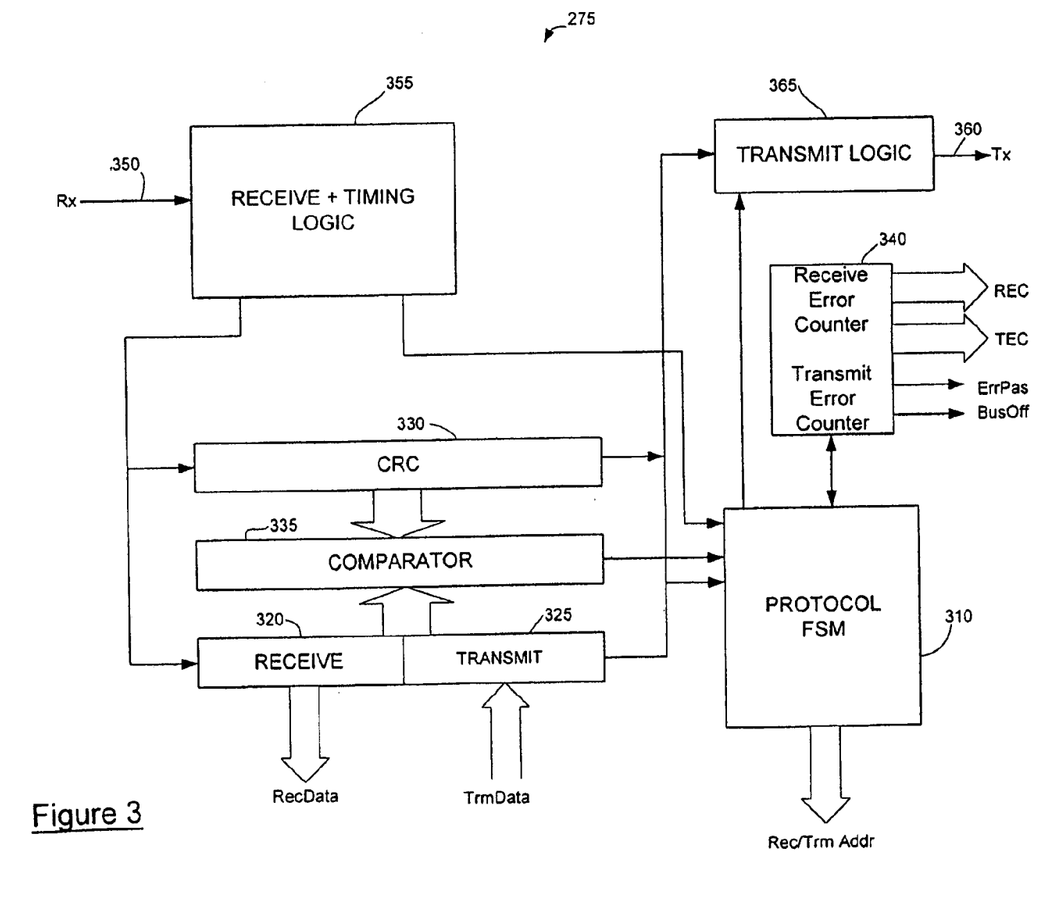
FIG. 3 shows details of the CAN protocol engine according to the exemplary embodiment shown in FIG. 2.

FIG. 3 shows the CAN protocol engine 275 in more detail. The protocol engine 275 combines several functional blocks. The heart of the engine 275 is the protocol finite state machine 310 (FSM). This state machine sequences through the messages on a bit by bit basis, changing states of the machine as various fields of various frame types are transmitted or received. The FSM 310 is a sequencer controlling the sequential data stream between the RX/TX shift register 320, 325, the CRC Register 330, and the receive bus line 350 and transmit bus line 360, respectively. The shift registers 320, 325 can be part of the message assembly register 270. Additional components 355 and 365 are provided to convert the data streams and adapt to the respective timing on the bus lines 350 and 360. The FSM also controls the Error Management Logic 340 (EML) and the parallel data stream RecData between the TX/RX shift register 320, 325 and other components of the CAN module. The processes of reception arbitration, transmission, and error signaling are performed according to the CAN protocol. The FSM 310 also handles any automatic transmission of messages on the bus line.

The data interface to the protocol engine 275 consists of byte wide transmit and receive data. Rather than assembling and shifting an entire frame, the frames are broken into bytes. A receive or transmit address from the protocol FSM 310 signifies which byte of the frame is current. For transmission, the appropriate byte from the transmit buffer is selected and presented to the engine, which then uses an 8-bit shift register to serialize the data. For reception, an 8-bit shift register assembles a byte which is then loaded within the appropriate byte in the message assembly buffer 270.

The cyclic redundancy check register 330 generates the Cyclic Redundancy Check (CRC) code to be transmitted over the data bytes and checks the CRC code of incoming messages. The Error Management Logic (EML) 340 is responsible for the fault confinement of the CAN device. Its counters, the Receive Error Counter and the Transmit Error Counter, are incremented and decremented by commands from the Bit stream processor. According to the values of the error counters, the CAN controller is set into states error active, error passive or bus off.

The Bit Timing Logic (BTL) within unit 355 monitors the bus line input and handles the bus line related bit timing according to the CAN protocol. The BTL synchronizes on a recessive to dominant bus line transition at Start of Frame and on any further recessive to dominant bus line transition, if the CAN controller itself does not transmit a dominant bit. The BTL also provides programmable time segments to compensate for the propagation delay time and for phase shifts and in defining the position of the Sample Point in the bit time. The programming of the BTL depends on the baud rate and on external physical delay times.

Figure 4:
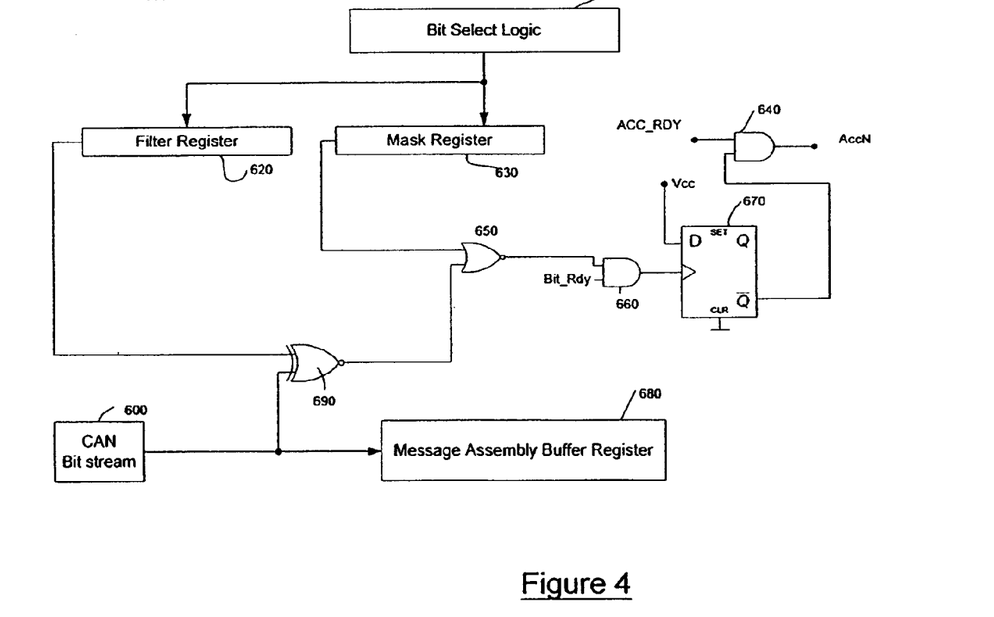
FIG. 4 shows details of a serial bit comparator unit according to FIG. 2.

In FIG. 4 an exemplary embodiment of a comparator unit according to the present invention is shown. The details are shown for a single Bit comparator unit, but apply for all other bit comparator units accordingly. Numeral 600 indicates a unit providing a CAN serial data stream which is fed to a message assembly buffer register 680 and the first input of an Exclusive NOR gate 690. The single bit output of a filter register 620 is coupled with the second input of Exclusive NOR gate 690 whose output is connected with the first input of a NOR gate 650. The second input of NOR gate 650 receives the single bit output signal from mask register 630. The output of NOR gate 650 is coupled with the first input of an AND gate 660 whose output is coupled with the control input of a D-Flip-Flop 670. Input D of D-Flip-Flop 670 is coupled with a logical "low" signal such as Vcc. The inverting output of D-Flip-Flop 670 is coupled with the first input of AND gate 640 whose output provides the acceptance signal. AND gates 640 and 660 comprises second inputs ACC_RDY and BIT_RDY, respectively which are used for synchronization with the respective input signals. A Bit Select Logic 610 is coupled with filter register 620 and mask register 630 to select the respective bits which will be used for comparison within each frame.

The incoming CAN bit stream is synchronized with the bit select logic 610. In other words, bit select logic 610 selects the respective bit in filter register 620 and mask register 630 that corresponds to the incoming bit of the serial bit stream. The actual comparator is formed by Exclusive NOR gate 690 which only generates a logic "high" at its output if both input signals are identical. NOR gate 650 is used as a mask unit to mask out a result if a respective bit within the mask register 630 is set. D-Flip-Flop 670 is used as a register to accumulate the results within a chain of comparisons and is preset to "1" at the start of a frame. Only if all comparisons within a frame are successful, then the acceptance signal AccN at the output of AND gate 640 will be generated. Otherwise the D-Flip-Flop 670 is set to "0" by a false comparison result and stays "0" until the end of the frame. The two control signals ACC_RDY and BIT_RDY are used to synchronize and activate the respective signals.

Figure 5:
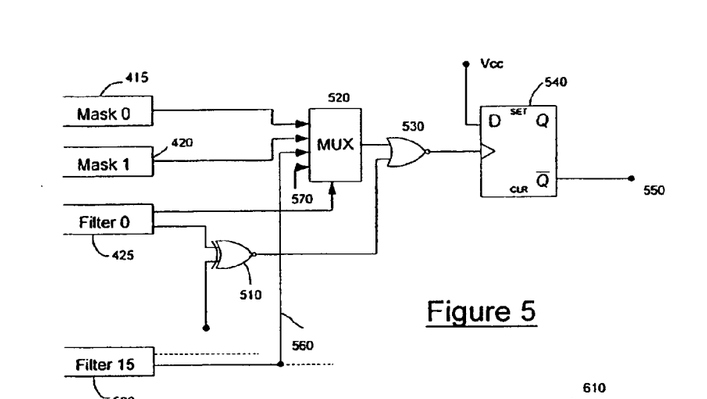
FIG. 5 shows another embodiment of a serial bit comparator according to FIG. 2.

FIG. 5 shows another exemplary embodiment of a bit comparator unit 435, 440 with even more functionality in more detail. Again, the details are shown for Bit comparator unit 0 but apply for all other bit comparator units accordingly. The outputs of mask register 415 and 420 are coupled with first and second inputs of a 4:1 multiplexer 520. Additional input 560 and 570 can be provided at the third and fourth input of multiplexer 520. For example, input 560 is coupled with the output of filter register 15 which is designated by numeral 580. Filter register 425 comprises, for example, two additional outputs which are coupled with the select input of multiplexer 520. The output of multiplexer 520 is connected to the first input of a NOR gate 530. NOR gate 530 operates as a validation unit indicating whether a comparison result will be used or ignored. The second input of NOR gate 530 is coupled with the output of an Exclusive NOR gate 510 whose first input receives the bit output signal from filter register 425 and whose second input receives the serial data stream from CAN protocol engine 495. The output of NOR gate 530 is coupled with the control input of a D-Flip-Flop 540. The D-input of D-Flip-Flop 540 receives a logical low signal. The acceptance signal is carried at the negating output 550 of D-Flip-Flop 540.

The first comparison stage is formed by Exclusive NOR gate 510. In this stage the identifier bits of the serial bit stream are compared with the respective bits of filter register 425. Exclusive NOR gate 510 only generates a logic "high" at its output if both input signals are identical. Sequencer unit 410 selects the respective bits within filter register 425. Filter register 425 comprises additional data bits which indicate which mask register should be used. In this exemplary embodiment, four different values can be selected. Either one of the mask registers 415 or 420 can be selected or a third value can be provided by another filter register, for example filter register 15. The fourth possible selection 570 can be used to indicate that no mask will be used by providing a respective level, for example, a logical "1". Thus, each filter register 425, 430 can be assigned an individual mask function. The selected mask value will be put at the first input of NOR gate 530. If the mask value indicates that the respective bit in filter register 425 should be used, NOR gate 530 will operate as a controllable switch and feed the comparison result of Exclusive NOR gate 510 to the control input D-Flip-Flop 540. D-Flip-Flop 540 is used as a register which is preset to "1". If the result of one comparison is negative indicating no match and the respective mask bit is valid, D-Flip-Flop 540 will be cleared and no acceptance signal 550 will be generated. D-Flip-Flop 540 thus will be reset to "0". D-Flip-Flop 540 will be preset to "1" again beginning with the next frame to compare another identifier as described above.

Any other type of appropriate logic can be used to implement the comparator. For example, controllable switches, equivalent Boolean operators, etc. can be used. Furthermore, the validation unit can be either put in front of the comparator or after the comparator. The essential function of a validation unit is to either incorporate selected bits or exclude them from comparison.

Figure 6:
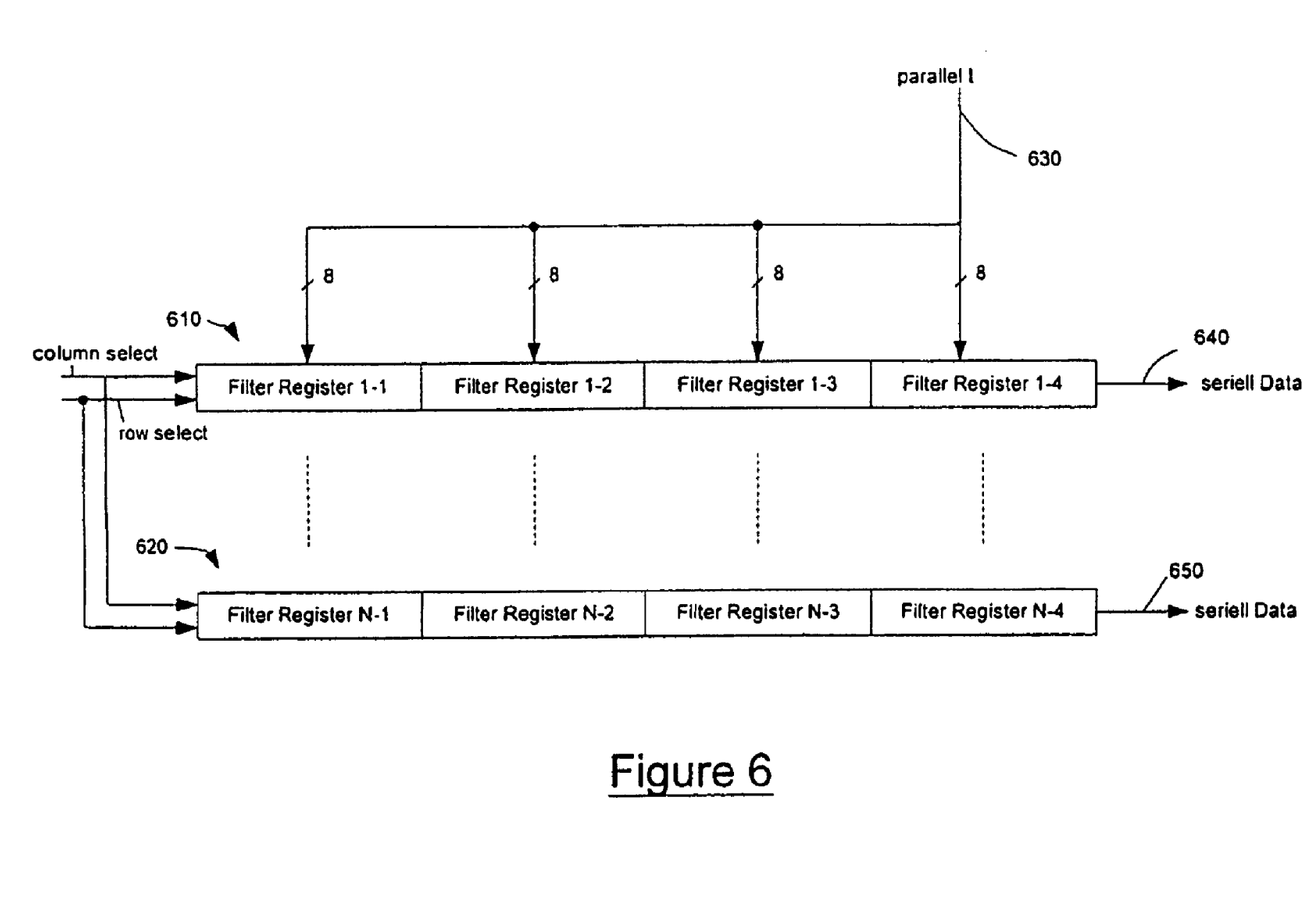
FIG. 6 is a block diagram showing the filter register bank according to the present invention.

FIG. 6 shows a block diagram of a filter register bank according to the present invention. To be suitable for the embodiments shown in the above figures, each filter register in the filter bank can be accessed in parallel by a CPU. However, a register bank according to this exemplary embodiment can be used by any other application which requires parallel input and serial output. For the parallel access, the filter registers 610 . . . 620 receive a column address and a row address. Each filter 610 . . . 620 consists, for example, of four 8-Bit registers. In the shown embodiment, filter register 1 comprises filter registers 1-1, 1-2, 1-3, and 1-4. For parallel access a 32-Bit data bus 630 is provided. In addition, a serial data bus 640 . . . 650 is provided for each filter register 610 . . . 620. In another embodiment parallel data bus 630 is a eight bit data bus and row select lines are separately provided for each partial register.

The CPU or any other device having parallel access to the filter register bank can read and write into each filter through parallel data bus 630. To this end, a complete filter register 610 is selected through respective row select lines as will be explained in more detail later. A multiplexer (not shown) then selects which partial register is accessed. The comparison with the serial data stream is done on a bit by bit base as explained above. To this end, a respective column select line instead of the row select lines activates the associated bit cell in each filter register 610 . . . 620. Thus, each serial bus 640 . . . 650 will carry the content of the selected bit cell within each filter register.

Figure 7:
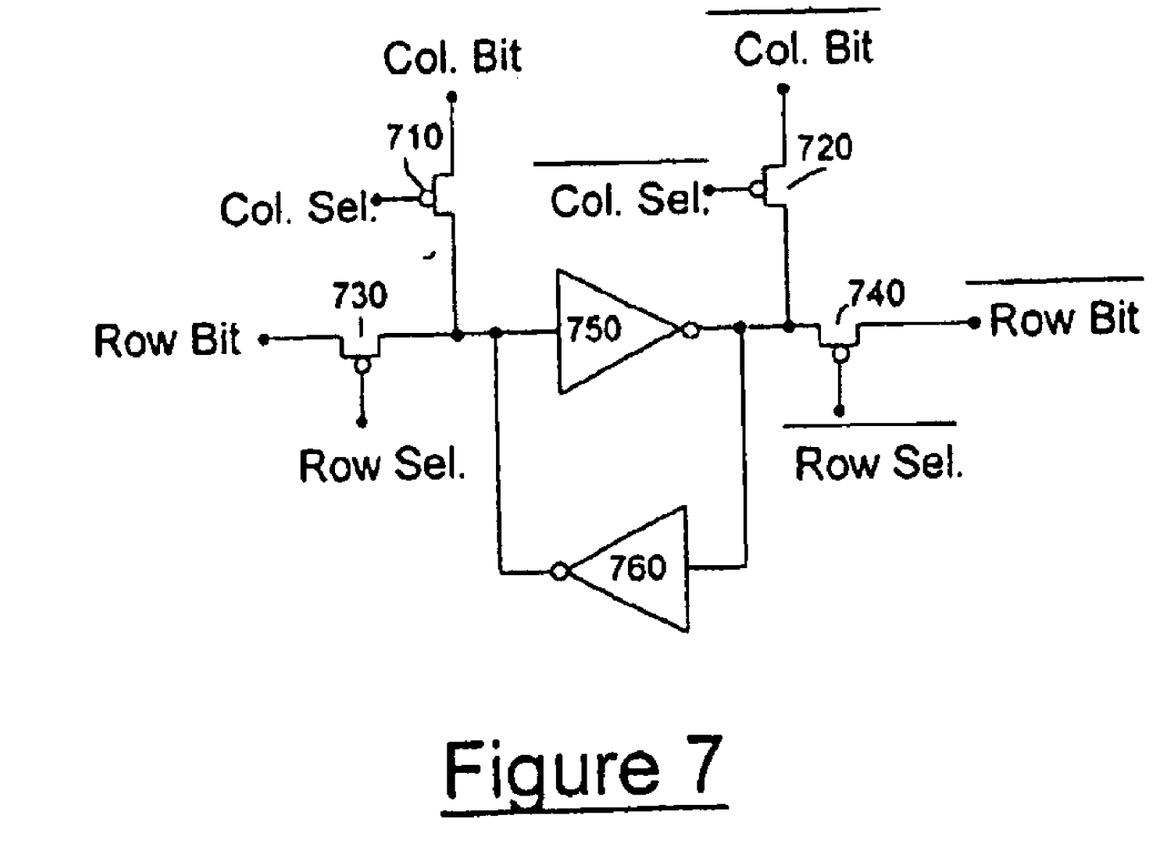
FIG. 7 show a single memory cell within a filter register according to the present invention.

FIG. 7 shows details of a suitable single bit cell. The cell proper consists of a hold element which is formed by two inverters 750 and 760 which are coupled in series such that the output of inverter 750 is connected to the input of inverter 760 and the output of inverter 760 is connected to the input of inverter 750. Any other suitable element for storing information can be used as known from memory technology to a person skilled in the art. Two selectable access paths are provided. The row access path Row Bit is coupled with the input of inverter 750 through a transfer gate 730 and #Row Bit is coupled with the inverted side through transfer gate 740. Furthermore, the column access path Col. Bit is coupled with the input of inverter 750 through a transfer gate 710 and #Col. Bit with the inverted side through transfer gate 720. The control inputs of the transfer gates 710, 730, and 720, 740 receive respective control signals Col. Sel., Row Sel., #Col.Sel., and #Row Sel.

Figure 8:
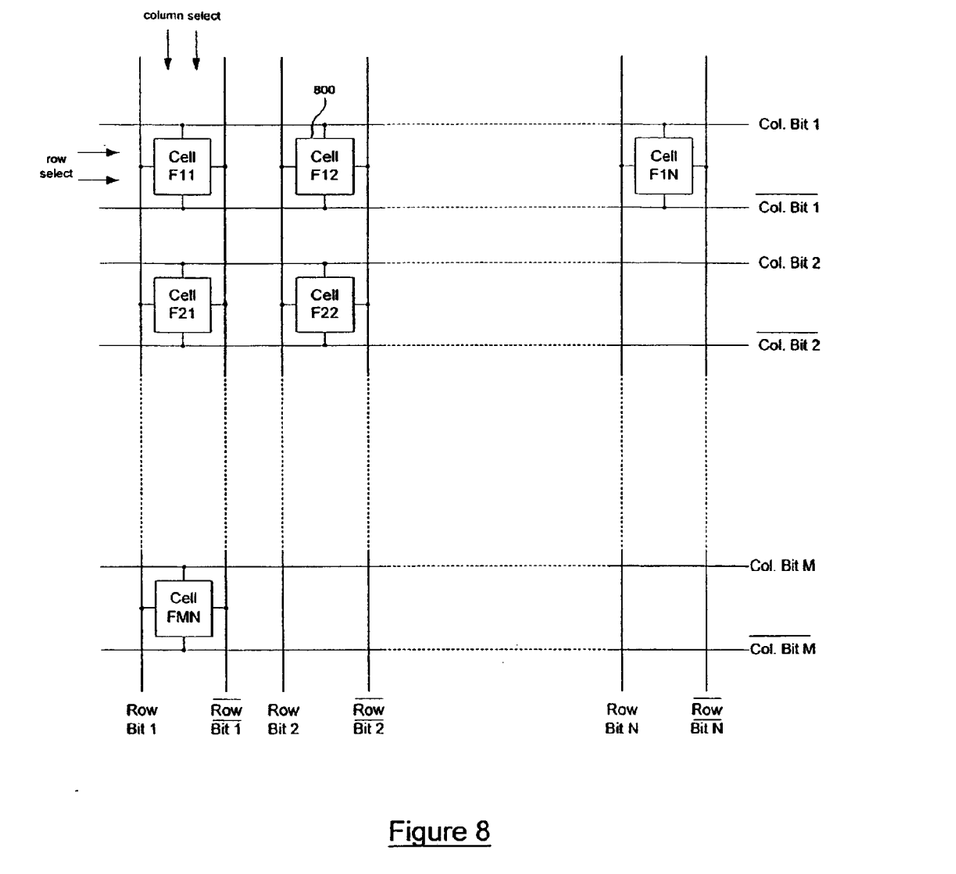
FIG. 8 shows the block diagram of FIG. 6 using the memory cells according to FIG. 7.

FIG. 8 shows an arrangement of these memory cells to form a filter bank as shown in FIG. 6. A plurality of cells 800 is arranged in form of a matrix, whereby a row comprises N cells 800 and a column comprises M cells. For each row two column bit lines, non-inverting Col. Bit M and inverting #Col. Bit M, are provided. Column bit lines Col. Bit M and #Col. Bit M are coupled with all respective column bit lines of each cell in this row. On the other hand, all row bit lines Row Bit N and #Row Bit N of each column are coupled with the respective row bit lines of each memory cell of each column. If only one partial register should be accessed in parallel, separate row lines for each partial register are provided and coupled with all cells of the partial register. The select lines are coupled as follows: All row select lines of each row are connected to the respective row select lines of each memory cell of a row and all column select lines of each column are connected to the respective column select lines of each memory cell of a column (For a better view, the interconnection of the select lines is not shown in FIG. 8). Thus, in a CAN application, a single bit comparison for all filter registers can be performed in parallel.

By selecting one of the pair of row select lines all memory cells of a row, for example F11, F12, F13, . . . F1N are coupled with the respective pair of row bit lines. Thus, a parallel access to a single filter register is possible. If on the other hand, a pair of column select lines is activated, all column bit lines of the memory cells within the selected column connect to their respective pair of column bit lines. Thus, serial access to a single bit within all filter registers is possible. Column bit lines and row bit lines provide respective bit amplifiers at their respective matrix sides which provide proper signal level for following circuitry.

The register bank is shown in combination with a CAN application. However, such a register bank is not limited to CAN. As can be seen by a person skilled in the art, any application which requires parallel access on one hand and serial access on the other can benefit from a register bank as described above.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A filter register bank for a CAN module providing parallel and serial access comprising:

a plurality of memory cells arranged in a matrix of columns and rows, wherein for parallel access all memory cells within a row are selectable and coupled with a first plurality of bus lines and for serial access all memory cells within a column are selectable and coupled with a second plurality of bus lines.

2. The filter register bank according to claim 1, wherein each memory cell comprises a hold element being coupled with a first and second transfer gate for coupling with said first and second bus lines, respectively.

3. The filter register bank according to claim 2, wherein said hold element comprises two inverters coupled in series.

4. The filter register bank according to claim 3, wherein each bus line comprises a non-inverting and an inverting bus line and each memory cell comprises a pair of first transfer gates and a pair of second transfer gates coupled with the input and output of said inverters, respectively.

5. A CAN module receiving a serial bit stream comprising:

a filter register comprising a plurality of memory cells arranged in a matrix of columns and rows, wherein for parallel access all memory cells within a row are selectable and coupled with a first plurality of bus lines and for serial access all memory cells within a column are selectable and coupled with a second plurality of bus lines;

a column select unit for selecting a column of said filter register bank in accordance with said serial bit stream;

a plurality of comparators coupled with said single bit column and with said serial bit stream for generating a plurality of comparison signals; and a plurality of registers receiving said plurality of comparison signals for accumulating a plurality of comparison results for each comparison and for generating a plurality of acceptance signals.

6. A CAN module according to claim 5, further comprising a mask register having a bit select input and a single bit output;

a plurality of mask units receiving said mask single bit output and said plurality of comparison results and generating a plurality of result signals being fed to said plurality of registers.

7. A CAN module according to claim 6, further comprising at least two mask registers having a bit select input and a single bit output;

a plurality of multiplexers for selecting one of said mask register single bit outputs.

8. A CAN module according to claim 7, wherein each multiplexer comprises an input which is coupled with the single bit output of one of said filter register.

9. A CAN module according to claim 7, wherein each multiplexer comprises an input which is coupled with a constant signal indicating no mask function.

10. A CAN module according to claim 7, wherein each multiplexer is controlled by at least one bit from a respective filter register.

11. A CAN module according to claim 10, wherein each filter register comprises two additional bits to control said multiplexer.

12. A CAN module according to claim 5, wherein one of said comparators is an EXCLUSIVE NOR gate.

13. A CAN module according to claim 6, wherein a mask unit is a NOR gate.

14. A CAN module according to claim 5, wherein said register is a D-Flip-Flop.

15. A CAN module according to claim 5, wherein each memory cell comprises a hold element being coupled with a first and second transfer gate for coupling with said first and second bus lines, respectively.

16. A CAN module according to claim 15, wherein said hold element comprises two inverters coupled in series.

17. A CAN module according to claim 5, wherein each bus line comprises a non-inverting and an inverting bus line and each memory cell comprises a pair of first transfer gates and a pair of second transfer gates coupled with the input and output of said inverters, respectively.

18. A method of operating a CAN module comprising the steps of:

writing a filter value in parallel into a filter bank;

receiving a data stream including an identifier and data;

comparing said identifier with a plurality of filter values on a bit by bit basis;

generating an acceptance signal for each comparison if said identifier comparison is positive.

19. A method according to claim 18, further comprising the step of masking said comparison result on a bit by bit basis.

20. A method according to claim 19, further comprising the step of selecting a mask value from a plurality of mask values.

21. A method according to claim 20, wherein said filter value provides additional data information for selecting said mask value.

22. A method according to claim 20, wherein said mask values is selected from a plurality of mask registers and filter registers.

23. A method according to claim 20, wherein one mask value provides a non-masking function.

24. A register bank providing parallel and serial access comprising:

a plurality of memory cells arranged in a matrix of columns and rows, wherein for parallel access all memory cells within a row are selectable and coupled with a first plurality of bus lines and for serial access all memory cells within a column are selectable and coupled with a second plurality of bus lines, wherein each memory cell comprises a hold element being coupled with a first and second transfer sate for coupling with said first and second bus lines, respectively.

25. The register bank according to claim 24, wherein said hold element comprises two inverters coupled in series.

26. The register bank according to claim 25, wherein each bus line comprises a non-inverting and an inverting bus line and each memory cell comprises a pair of first transfer gates and a pair of second transfer gates coupled with the input and output of said inverters, respectively.

* * * * *

UNITED STATES PATENT AND TRADEMARK OFFICE
CERTIFICATE OF CORRECTION

| | | |
|---|---|---|
| PATENT NO. | : 6,944,739 B2 | Page 1 of 1 |
| APPLICATION NO. | : 09/957283 | |
| DATED | : September 13, 2005 | |
| INVENTOR(S) | : James E. Bartling, Joseph A. Thomsen and Randy Yach | |

It is certified that error appears in the above-identified patent and that said Letters Patent is hereby corrected as shown below:

Title Page, Patent Col. (75) Inventor: James R. Bartling, should be corrected to read: James E. Bartling.

Signed and Sealed this

Twenty-fifth Day of July, 2006

JON W. DUDAS
*Director of the United States Patent and Trademark Office*